(12) United States Patent
Pan et al.

(10) Patent No.: US 8,984,749 B2
(45) Date of Patent: Mar. 24, 2015

(54) METHOD OF ROUTING ONE OR MORE CABLES THROUGH AN ENCLOSURE

(71) Applicant: Siemens Industry, Inc., Alpharetta, GA (US)

(72) Inventors: Xiong Pan, Raleigh, NC (US); Truett Ramsey Thompson, Raleigh, NC (US); Bernhard Schmidt, Cary, NC (US)

(73) Assignee: Siemens Industry, Inc., Alpharetta, GA (US)

( * ) Notice: Subject to any disclaimer, the term of this patent is extended or adjusted under 35 U.S.C. 154(b) by 146 days.

(21) Appl. No.: 13/624,584

(22) Filed: Sep. 21, 2012

(65) Prior Publication Data

US 2013/0319753 A1    Dec. 5, 2013

Related U.S. Application Data

(60) Provisional application No. 61/655,880, filed on Jun. 5, 2012.

(51) Int. Cl.
*H01R 43/00* (2006.01)
*H05K 7/14* (2006.01)

(52) U.S. Cl.
CPC .................................. *H05K 7/1432* (2013.01)
USPC .................................. 29/868; 29/428; 29/454

(58) Field of Classification Search
CPC .............. G06F 1/1632; B60H 1/00564; B60H 2001/00099; E05D 7/02; E05D 7/081
USPC ............ 29/868, 428, 454, 825; 174/17 R, 50, 174/50.52, 59, 68.1, 541; 361/679.09, 361/679.26, 679.58, 679.6, 726, 727
See application file for complete search history.

(56) References Cited

U.S. PATENT DOCUMENTS 6,545,863 B2 *   4/2003   Huggins .................. 361/679.58

* cited by examiner

*Primary Examiner* — Thiem Phan

(57) ABSTRACT

An electrical enclosure that may house electrical equipment having a reconfigurable cable duct system with one or more movable flaps to form alternative pathways in the enclosure for routing electrical cables from connections inside the enclosure to designated areas outside the enclosure. Methods of routing electrical cables through an enclosure and of assembling a cable duct system within an enclosure are also provided, as are other aspects.

3 Claims, 10 Drawing Sheets

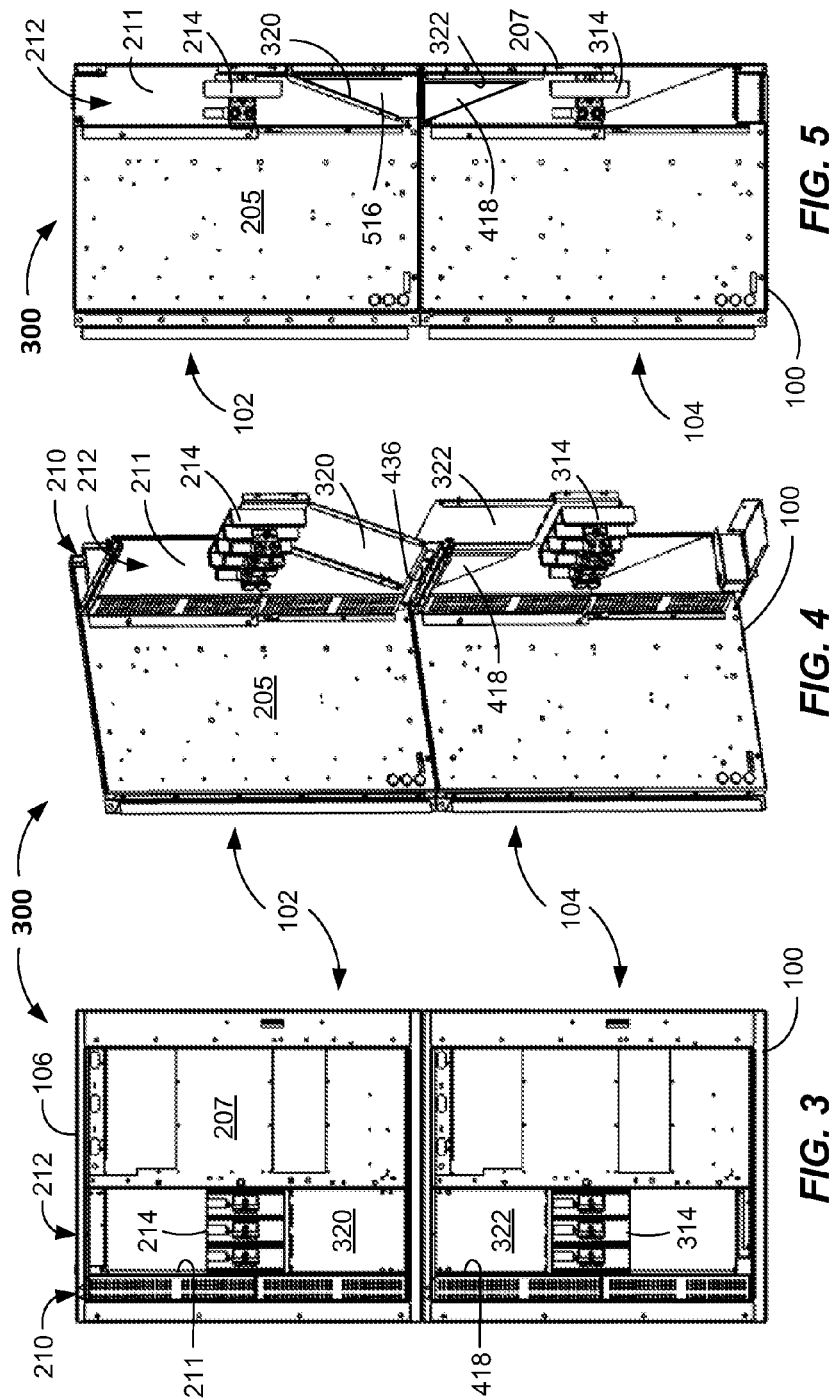

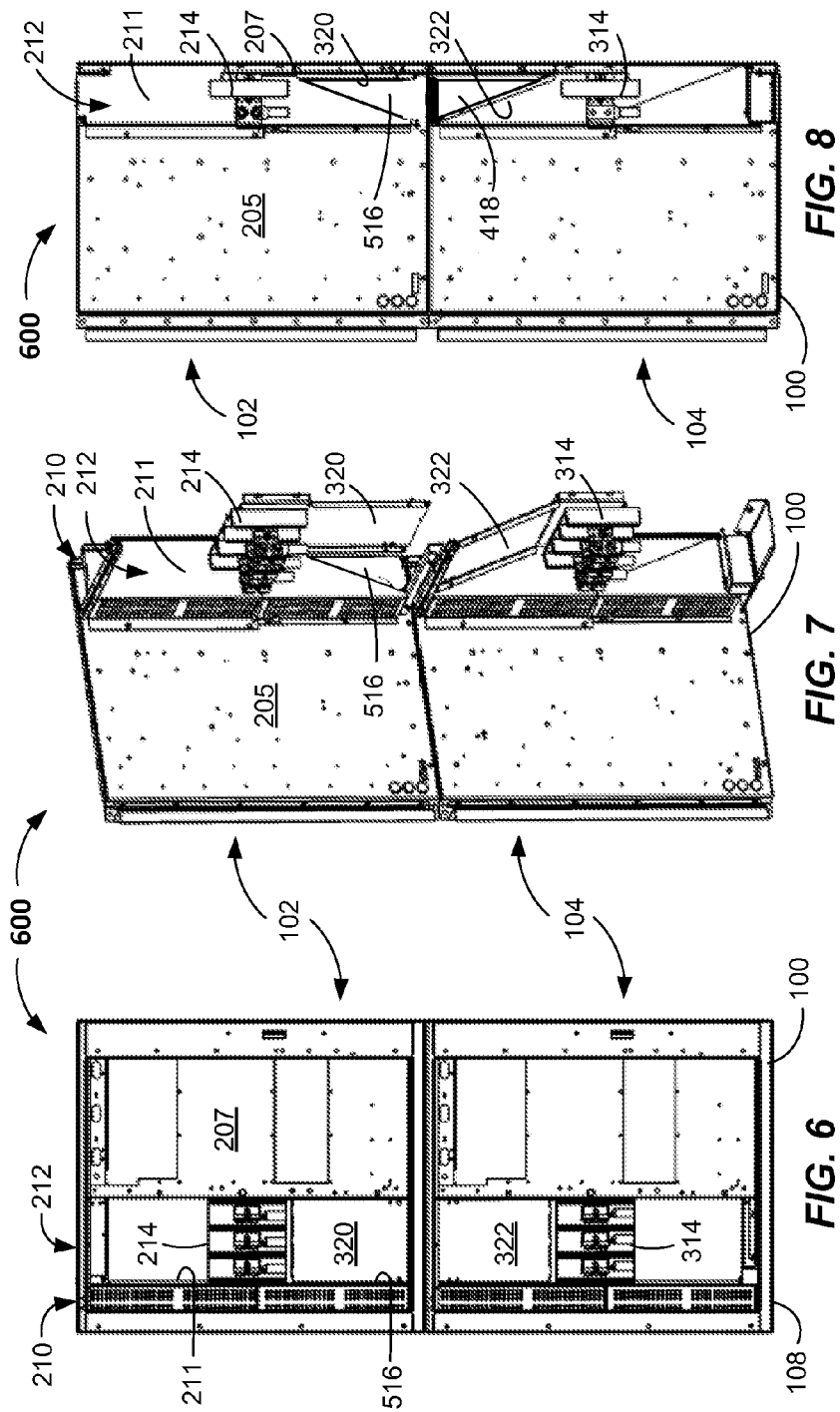

METHOD OF ROUTING ONE OR MORE CABLES THROUGH AN ENCLOSURE

CROSS REFERENCE TO RELATED APPLICATION

This claims the benefit of U.S. Provisional Patent Application No. 61/655,880, filed Jun. 5, 2012, which is hereby incorporated by reference herein in its entirety.

FIELD

The invention relates generally to cable duct systems within enclosures that may house electrical equipment, and more particularly to configurations of cable duct systems providing cable paths within an enclosure for routing electrical cables there through.

BACKGROUND

Enclosures that house electrical equipment, such as, e.g., motor controllers, may require connection to one or more external electrical cables at an installation site. The external electrical cables may provide, e.g., power and/or control signaling to the electrical equipment. Generally, external electrical cables at an installation site are received through either the top or the bottom of the electrical equipment enclosure, and the top or bottom cable feed direction is usually specified when the electrical equipment is ordered. Cable ducts for routing the external electrical cables within the enclosure are usually configured based on the specified cable feed direction prior to delivery of the enclosure to an installation site. However, at the installation site, the cable feed direction may have to change from top of the enclosure to bottom of the enclosure or vice versa. Such a change may render the configured cable ducts within the enclosure unusable. Accordingly, a need exists to provide electrical equipment enclosures with a cable duct system that can be reconfigured at an installation site.

SUMMARY

According to one aspect, an improved enclosure configured to house electrical equipment is provided. The enclosure includes a top, a bottom, and one or more side walls forming an enclosed structure; first and second cable ducts located side-by-side within the enclosed structure, the first and second cable ducts having at least one wall between them, the at least one wall extending parallel to the one or more side walls of the enclosed structure, the first and second cable ducts having a first opening in the at least one wall between them, the first opening configured to receive an electrical cable there through; a first cable terminal located in one of the first and second cable ducts, the first cable terminal configured to be electrically connected to an electrical cable; and a first movable flap located in one of the first and second cable ducts, the first movable flap configured to have first and second positions, wherein in the first position the first movable flap prevents an electrical cable connected to the first cable terminal from passing through the first opening and in the second position the first movable flap allows an electrical cable connected to the first cable terminal to pass through the first opening.

According to another aspect, a method of routing one or more cables through an enclosure is provided. The method includes setting a first flap in one of two positions based on whether a first cable is to exit an enclosure through an opening in the top or in the bottom of the enclosure, electrically connecting the first cable to a cable terminal located in a first cable duct of the enclosure, feeding the first cable through the first cable duct from the cable terminal, feeding the first cable into a second cable duct of the enclosure from the first cable duct through a first opening between the first and second cable ducts, and passing the first cable from the second cable duct through an opening in a top or a bottom of the enclosure.

According to yet another aspect, a second method of routing one or more cables through an enclosure is provided. The method includes setting a first flap in a first position to block a first portion of a first cable duct from a second portion of the first cable duct or to block a first opening between the first cable duct and a second cable duct, electrically connecting a first cable to a first cable terminal located in the first cable duct, feeding the first cable through a first cable duct from the first cable terminal; passing the first cable through an opening in a top of an enclosure, electrically connecting a second cable to a second cable terminal located in the first cable duct, feeding the second cable through the first cable duct from the second cable terminal, and passing the second cable through an opening in a bottom of the enclosure.

According to a further aspect, a third method of routing one or more cables through an enclosure is provided. The method includes withdrawing first and second cables routed in a first cable feed direction from first and second cable ducts configured within the housing; moving at least one duct flap in the first or second cable duct from a first position to a second position, wherein the at least one flap in the first position prevents one of the first and second cables from being routed through an opening between the first and second cable ducts, and the at least one flap in the second position prevents the other of the first and second cables from being routed through the opening between the first and second cable ducts; and routing the first and second cables in a second cable feed direction through the first and second cable ducts.

According to a still further aspect, a method of assembling a cable duct system is provided. The method includes providing an enclosure; providing first and second cable ducts within the enclosure, the first and second cable ducts having a first opening there between configured to receive a cable there through from one of the first and second cable ducts to the other of the first and second cable ducts; and providing a first movable flap in the first cable duct, the first movable flap having first and second positions wherein in the first position the first movable flap prevents a cable from being received through the first opening and in the second position the first movable flap allows a cable to be received through the first opening.

Still other aspects, features, and advantages of the invention may be readily apparent from the following detailed description wherein a number of exemplary embodiments and implementations are described and illustrated, including the best mode contemplated for carrying out the invention. The invention may also be capable of other and different embodiments, and its several details may be modified in various respects, all without departing from the scope of the invention. Accordingly, the drawings and descriptions are to be regarded as illustrative in nature, and not as restrictive. The drawings are not necessarily drawn to scale. The invention covers all modifications, equivalents, and alternatives falling within the scope of the invention.

BRIEF DESCRIPTION OF DRAWINGS

FIGS. 3-5 illustrate cut-away front, perspective, and side views, respectively, of an enclosure having a cable duct system in an upward cable feed configuration according to embodiments.

FIGS. 6-8 illustrate cut-away front, perspective, and side views, respectively, of an enclosure having a cable duct system in a downward cable feed configuration according to embodiments.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts.

The aforementioned problem of providing electrical equipment enclosures with a cable duct system that can be reconfigured at an installation site may be overcome by one or more embodiments of the invention. In one aspect, an enclosure may have an upper enclosure cell and a lower enclosure cell, where each enclosure cell may include electrical equipment requiring connection to separate electrical cables. The enclosure may include two vertical side-by-side cable ducts that may extend continuously through both the upper and lower enclosure cells. The two side-by-side cable ducts may have a pair of openings there between, one in each enclosure cell, configured to receive an electrical cable there through. A movable flap in one of the cable ducts may be initially configured to block one of the openings depending on a specified cable feed direction (that is, e.g., from the top or the bottom of the enclosure). If, at an installation site, the cable feed direction is different, the movable flap may be reconfigured to block the other of the two openings to provide alternative cable paths to accommodate the changed cable feed direction. In other aspects, methods of routing one or more cables through an enclosure and methods of assembling a cable duct system are provided, as will be explained in greater detail below in connection with FIGS. 1-15.

Figure 1:
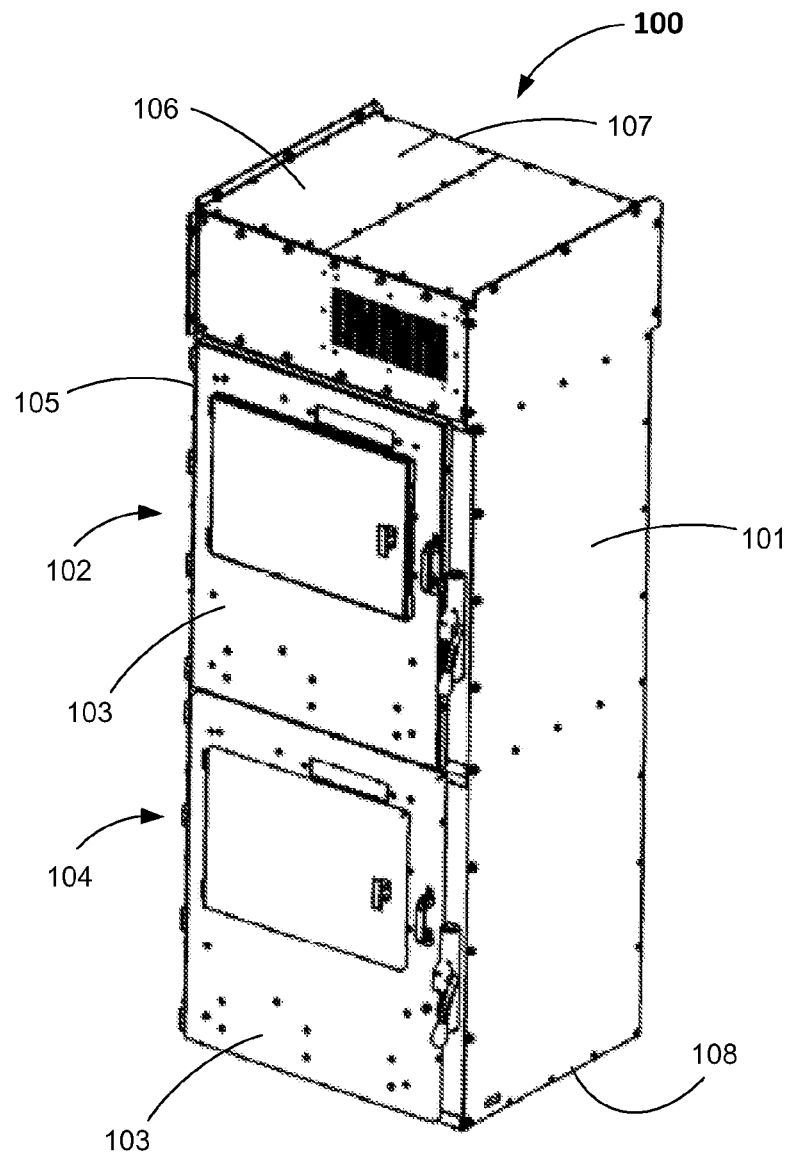
FIG. 1 illustrates a perspective view of an enclosure that may be used to house electrical equipment according to embodiments.

FIG. 1 illustrates an enclosure 100 that may house electrical equipment, such as, e.g., one or more voltage controllers, in accordance with one or more embodiments. Enclosure 100 may be a generally rectangular enclosed structure that may have a right side wall 101, front access doors 103, left side wall 105, and back side wall 107. Enclosure 100 may include an upper enclosure cell 102 stacked on top of a lower enclosure cell 104. Upper enclosure cell 102 and lower enclosure cell 104 may each include separate electrical equipment, such as respective voltage controllers, each requiring separate cable connections. Upper cell 102 and lower cell 104 may be constructed identically, or substantially identically, and may be electrically isolated from each other. That is, power and/or control signaling may be connected to respective electrical equipment therein via separate electrical cables routed to and within enclosure cells 102 and 104. External electrical cables may enter enclosure 100 via an access opening (see FIG. 11) through a top 106 and/or an access opening (see FIG. 12) through a bottom 108 of enclosure 100. Enclosure 100 may be made of sheet metal that, in some embodiments, may have a thickness of 11 gauge. Enclosure 100 may be assembled using any suitable technique including, e.g., welding, bolts and nuts, rivets, adhesives, and/or combinations thereof. Other suitable sheet metal gauges, materials, and/or configurations may alternatively be used to construct enclosure 100. In some embodiments, enclosure 100 may be constructed in compliance with one or more NEMA® (National Electrical Manufacturers Association) standards, such as those applicable to, e.g., general purpose, dust tight, outdoor, and/or arc-resistant enclosures. In some embodiments, enclosure 100 may additionally or alternatively comply with other appropriate safety and/or electrical standards, such as those by, e.g., UL (Underwriters Laboratories) and the IEEE (Institute of Electrical and Electronics Engineers).

Figure 2:
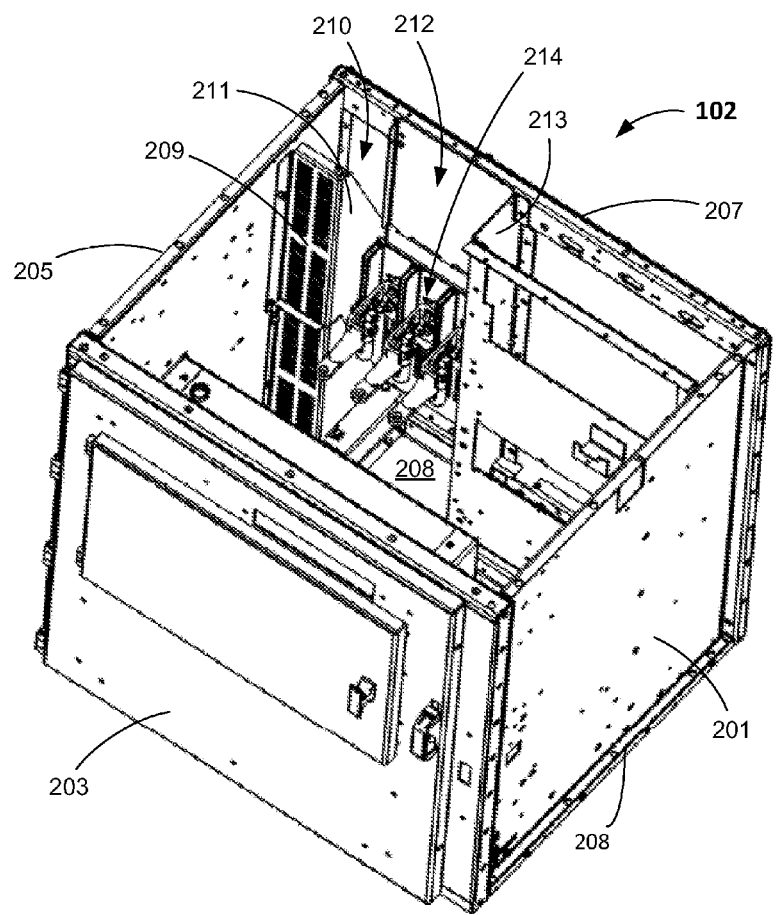
FIG. 2 illustrates a top perspective view of an enclosure cell according to embodiments, with the top removed for illustration purposes.

FIG. 2 illustrates cable ducts 210 and 212 of a cable duct system as seen from the top of upper enclosure cell 102 (which may be identical to that seen from the top of lower enclosure cell 104) in accordance with one or more embodiments. Enclosure cell 102 may have right side wall 201, front wall/access door 203, left side wall 205, back side wall 207, a bottom 208, and a top (not shown). In some alternative embodiments, enclosure cell 102 may not have one or more side walls 201, 205, and/or 207 but, instead, may have an open frame type construction, relying on one or more exterior side walls of an enclosure, such as, e.g., side wall 101 of enclosure 100, for enclosure of electrical equipment that may be housed therein. Enclosure cell 102 may be made of sheet metal (such as, e.g., 11 gauge sheet metal) and may be assembled using any suitable technique including, e.g., welding, bolts and nuts, rivets, adhesives, and/or combinations thereof. Other suitable sheet metal gauges, materials, and/or configurations may alternatively be used to construct enclosure cell 102. In some embodiments, upper enclosure cell 102 and lower enclosure cell 104 may be constructed such that they may be exchangeable within an enclosure (i.e., upper enclosure cell 102 may become a lower enclosure cell and/or lower enclosure cell 104 may become an upper enclosure cell).

Cable ducts 210 and 212 may be arranged side-by-side, may be provided in a corner of enclosure cell 102, and may be formed by sharing portions of, e.g., left side wall 205 and back side wall 207. Cable ducts 210 and 212 may be the same size or of different size, as shown, and may have at least one interior wall 211 between them that may extend vertically along and may be generally parallel to the side walls 201, 205, and 207 of the upper enclosure cell 102. When upper enclosure cell 102 is stacked upon lower enclosure cell 104 (having the same orientation, e.g., both cells 102 and 104 having access doors 203 on the same side), cable ducts 210 and 212 of each enclosure cell align with each other to form a continuous side-by-side pair of cable ducts that may extend vertically through the entire enclosure 100. In some embodiments, cable duct 210 and/or cable duct 212 may not extend vertically through the entire enclosure 100. In other embodiments, cable ducts 210 and 212 may be arranged differently within stacked pairs of enclosure cells. For example, cable ducts 210 and 212 may be arranged in a different corner of stacked enclosure cells, or they may be arranged between corners along one of the side walls of stacked enclosure cells, such as, e.g., one of side walls 201, 205, or 207 (in which case, additional interior duct walls may be needed to construct cable ducts 210 and 212). In some embodiments, cable ducts 210 and 212 may be arranged within stacked enclosure cells such that no exterior enclosure cell wall or enclosure side wall is shared with cable ducts 210 and 212 (in which case, all duct walls will be interior walls of an enclosure cell). The interior walls of enclosure cell 102 that form cable ducts 210 and 212, such as interior walls 209, 211, and 213, may be constructed with sheet metal, which may be of the same gauge as the exterior side walls of enclosure cell 102 or enclosure 100. The interior walls that from cable ducts 210 and 212 may be secured to inside surfaces of exterior walls or frames of enclosure cell 102 via, e.g., sheet metal screws. Alternatively, the interior walls of enclosure cell 102 that form cable ducts 210 and 212 may be secured in any other suitable manner to any suitable inside surfaces of the exterior walls or frames of enclosure cell 102 or to any other suitable structures within enclosure cell 102. In some embodiments, the interior walls of cable ducts 210 and 212 may be ventilated, such as, e.g., interior wall 209. In this manner, the cable ducts may serve a dual purpose of routing cables and providing a ventilation channel through the enclosure cell 102. Other suitable materials may be used to construct the interior walls of cable ducts 210 and 212. In some embodiments, cable ducts 210 and 212 may have other suitable configurations. For example, in some embodiments, cable ducts 210 and 212 may not be arranged side-by-side but, instead, may be separate structures that may be connected to each other at one or more points with lateral connecting ducts.

Upper enclosure cell 102 may also include a cable terminal 214, which may be electrically connected to electrical equipment housed in enclosure cell 102. Cable terminal 214 may be configured to be electrically connectable to an external cable that may provide power and/or control signaling to electrical equipment housed in enclosure cell 102. Cable terminal 214 may be located within, e.g., cable duct 212, and may be mounted to an inside surface of back side wall 207. Alternatively, cable terminal 214 may be located within cable duct 210, and/or may be mounted to any suitable wall or structure within cable duct 210 or 212 of upper enclosure cell 102.

FIGS. 3-5 illustrate enclosure 100 having a cable duct system in an upward cable feed configuration 300 in accordance with one or more embodiments. Enclosure 100 may have cable ducts 210 and 212 extending vertically through upper and lower enclosure cells 102 and 104. Lower enclosure cell 104 may have a cable terminal 314 that may be configured to be electrically connectable to an external cable that may provide power and/or control signaling to electrical equipment that may be housed in lower enclosure cell 104. Cable terminal 314 may be located within, e.g., cable duct 212, and may be mounted to an inside surface of back side wall 207. Alternatively, cable terminal 314 may be located within cable duct 210, and/or may be mounted to any suitable wall or structure within cable duct 210 or 212 of lower enclosure cell 104. Cable terminal 314 may be identical or similar to cable terminal 214.

Interior wall 211 (i.e., the wall between the first and second cable ducts 210 and 212) may have a first opening 516 (shown in FIG. 5) in upper enclosure cell 102 and/or a second opening 418 (shown in FIGS. 4 and 5) in lower enclosure cell 104. Each opening 516 and 418 is configured to receive an electrical cable there through, either from cable duct 210 to cable duct 212 or vice versa. In some embodiments, openings 516 and 418 may form a single large opening.

Enclosure 100 may also include a duct flap 320 in cable duct 212 of upper enclosure cell 102 that, in the upward cable feed configuration 300, may be positioned diagonally across cable duct 212 (as best shown in FIGS. 4 and 5). This position of duct flap 320 may block a cable electrically connected to cable terminal 214 of upper enclosure cell 102 from openings 418 and 516. That position of duct flap 320 may also block the portion of cable duct 212 in lower enclosure cell 104, where the cable electrically connected to cable terminal 214 may interfere with a cable electrically connected to cable terminal 314. In some alternative embodiments, enclosure 100 may also have an optional duct flap 322 in the portion of cable duct 212 in lower enclosure cell 104. Optional duct flap 322 may be constructed identically or similarly as duct flap 320, which is described in more detail below in connection with FIG. 9. In the upward cable feed configuration 300, optional duct flap 322 may be positioned substantially vertically to and/or secured against back side wall 207, as best shown in FIGS. 4 and 5. With optional duct flap 322 in this position, or in those embodiments without optional duct flap 322, openings 418 and 516 may be accessible to a cable connecting to cable terminal 314, which may then be routed upward through cable duct 212, into one of openings 418 and/or 516, and upward through cable duct 210, where the cable may exit enclosure 100 from an opening (see FIG. 11) above cable duct 210 in the top 106 of enclosure 100. Routing electrical cables in the upward cable feed configuration 300 is described in more detail below in connection with FIGS. 10 and 11, FIGS. 6-8 illustrate enclosure 100 having a cable duct system in a downward cable feed configuration 600 in accordance with one or more embodiments. In the downward cable feed configuration 600, duct flap 320 may be optional. In those embodiments having optional duct flap 320, duct flap 320 may be positioned substantially vertically to and/or secured against back side wall 207, as best shown in FIGS. 7 and 8. With optional duct flap 320 in this position, or in those embodiments without optional duct flap 320, openings 418 and 516 may be accessible to a cable connecting to cable terminal 214, which may then be routed downward through cable duct 212, into one of openings 418 and/or 516, and downward through cable duct 210, where the cable may exit enclosure 100 from an opening (see FIG. 12) under cable duct 210 in the bottom 108 of enclosure 100. Duct flap 322, which is not optional in the downward cable feed configuration 600, is positioned diagonally across cable duct 212 in lower enclosure cell 104 (as best shown in FIGS. 7 and 8). This position of duct flap 322 may block a cable electrically connected to cable terminal 314 of lower enclosure cell 104 from openings 418 and 516. That position of duct flap 322 may also block the portion of cable duct 212 in upper enclosure cell 102, where the cable electrically connected to cable terminal 314 may interfere with a cable electrically connected to cable terminal 214. Routing electrical cables in the downward cable feed configuration 600 is described in more detail below in connection with FIGS. 10 and 12.

Figure 9:
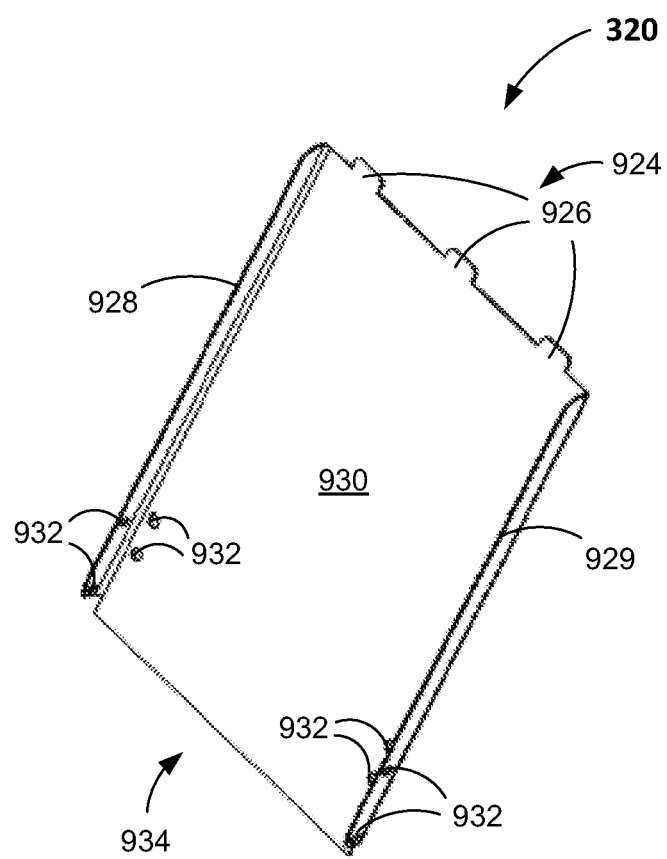
FIG. 9 illustrates a perspective view of a cable duct flap that may be used in a cable duct system according to embodiments.

FIG. 9 illustrates duct flap 320 in more detail in accordance with one or more embodiments. Duct flap 320 may be made of sheet metal or any other suitable material. One end 924 of duct flap 320 may have a plurality of tongues 926 configured to be inserted into corresponding grooves or slots (not shown) on or in a cable duct wall or other structure. In some embodiments, cable terminals 214 and/or 314 may have corresponding grooves or slots for receiving tongues 926 of duct flap 320. This tongue and groove connection may allow duct flap 320 to pivot from, e.g., the diagonal position shown in, e.g., FIGS. 4 and 5, to the optional substantially vertical position shown in, e.g., FIGS. 7 and 8. The tongue and groove connection may also allow duct flap end 924 to be easily removed without tools from a cable duct wall or other structure having corresponding grooves or slots. In alternative embodiments, duct flap end 924 may be configured to have a hinged connection, or any other suitable connection, that allows duct flap 320 to move between the diagonal and substantially vertical positions previously described. Duct flap 320 may have in some embodiments a pair of opposite side edges 928 and 929 that may be angled at about 90 degrees relative to a main body 930. Main body 930 and side edges 928 and 929 may have one or more screw holes 932 at the other end 934 of duct flap 320. Any one or more screw holes 932 may be used with, e.g., sheet metal screws, to secure end 934 to, e.g., a duct wall or frame member 436 (see FIG. 4) of cable duct 212. In alternative embodiments, duct flap end 934 may be secured in any suitable manner to any suitable structure within cable ducts 212 or 210.

Figure 10:
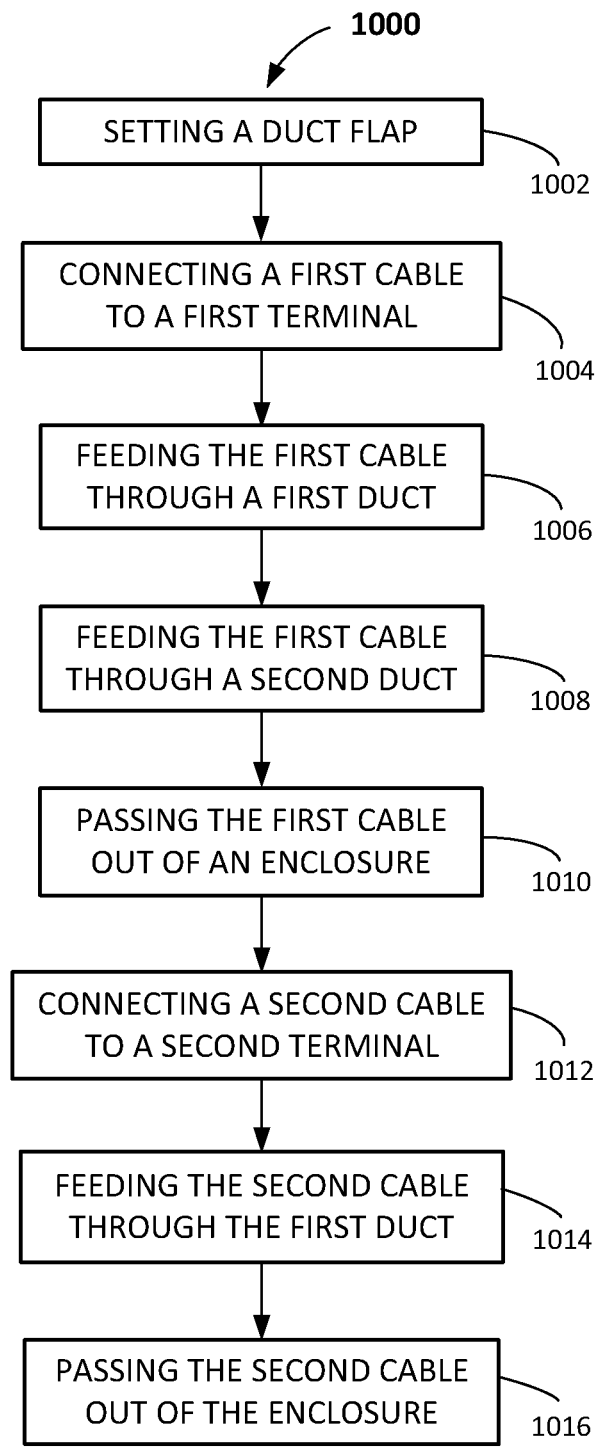
FIG. 10 illustrates a flowchart of a method of routing one or more cables through an enclosure to electrically connect to electrical equipment housed in the enclosure according to embodiments.

FIG. 10 illustrates a method of routing one or more cables through an enclosure to electrically connect to electrical equipment that may be housed in the enclosure in accordance with one or more embodiments. Method 1000 may include at process block 1002 setting a duct flap, such as, e.g., one of duct flaps 320 or 322, depending on which cable feed direction is required. For example, if an upward cable feed direction is desired, duct flap 320 in upper enclosure cell 102 may be set in the diagonal position across cable duct 212, as best shown in FIGS. 4 and 5. If a downward cable feed direction is required, duct flap 322 in lower enclosure cell 104 may be set in the diagonal position across cable duct 212, as best shown in FIGS. 7 and 8.

In those cases where an enclosure at an installation site requires a change in the cable feed configuration from, e.g., the upward cable feed configuration 300 to the downward cable feed configuration 600, the cable duct system of enclosure 100 may be reconfigured as follows (after withdrawing any previously routed cables from cable ducts 210 and 212). In those embodiments employing only duct flap 320 (i.e., optional duct flap 322 is not included), duct flap 320 may be removed from the diagonal position across cable duct 212 in the upper enclosure cell 102, as shown in FIGS. 4 and 5, and set in a diagonal position across cable duct 212 in the lower enclosure cell 104 as shown in FIGS. 7 and 8 for duct flap 322 (in other words, duct flap 320 replaces duct flap 322 as shown in FIGS. 7 and 8). In those embodiments employing both duct flaps 320 and 322, duct flap 320 may be pivoted from the diagonal position across cable duct 212 in the upper enclosure cell 102, as shown in FIGS. 4 and 5, to the substantially vertical position against back side wall 207, as shown in FIGS. 7 and 8. Duct flap 322 may be pivoted from the substantially vertical position against back side wall 207 in the lower enclosure cell 104, as shown in FIGS. 4 and 5, to the diagonal position across cable duct 212, as shown in FIGS. 7 and 8.

In those cases where an enclosure at an installation site requires a change in the cable feed configuration from, e.g., the downward cable feed configuration 600 to the upward cable feed configuration 300, the cable duct system of enclosure 100 may be reconfigured as follows (after withdrawing any previously routed cables from cable ducts 210 and 212). In those embodiments employing only duct flap 322 (i.e., optional duct flap 320 is not included), duct flap 322 may be removed from the diagonal position across cable duct 212 in the lower enclosure cell 104, as shown in FIGS. 7 and 8, and set in a diagonal position across cable duct 212 in the upper enclosure cell 102 as shown in FIGS. 4 and 5 for duct flap 320 (in other words, duct flap 322 replaces duct flap 320 as shown in FIGS. 4 and 5). In those embodiments employing both duct flaps 320 and 322, duct flap 322 may be pivoted from the diagonal position across cable duct 212 in the lower enclosure cell 104, as shown in FIGS. 7 and 8, to the substantially vertical position against back side wall 207, as shown in FIGS. 4 and 5. Duct flap 320 may be pivoted from the substantially vertical position against back side wall 207 in the upper enclosure cell 102, as shown in FIGS. 7 and 8, to the diagonal position across cable duct 212, as shown in FIGS. 4 and 5.

At process block 1004, method 1000 may include electrically connecting one end of a first electrical cable to a first cable terminal. For example, in an upward cable feed configuration, the first electrical cable may be connected to, e.g., cable terminal 314 of lower enclosure cell 104. In a downward cable feed configuration, the first electrical cable may be connected to, e.g., cable terminal 214 of upper enclosure cell 102. The electrical connection of the first cable to the first cable terminal may be made in any suitable manner.

At process block 1006, the first electrical cable may be fed through a first duct. In some embodiments, the first duct may be cable duct 212. In some alternative embodiments, the first duct may be cable duct 210 if, e.g., any one of cable terminals 214 and/or 314 is located in cable duct 210.

At process block 1008, method 1000 may include feeding the first electrical cable through a second duct. In some embodiments, the second duct may be cable duct 210, wherein the first cable may be fed from cable duct 212 through either opening 418 or 516 into cable duct 210. For example, in an upward cable feed configuration, the first cable may be fed from cable terminal 314 up through cable duct 212, through opening 418 or 516, and into cable duct 210. In a downward cable feed configuration, the first cable may be fed from cable terminal 214 down through cable duct 212, through opening 418 or 516, and into cable duct 210.

At process block 1010, the first electrical cable may be passed out of the enclosure. For example, in an upward cable feed configuration, the first electrical cable may, in some embodiments, be passed upward through cable duct 210 and out of enclosure 100 through an access opening (see FIG. 11) in the top 106 of enclosure 100. In some embodiments, the access opening may be directly above cable duct 210. In a downward cable feed configuration, the first electrical cable may, in some embodiments, be passed downward through cable duct 210 and out of enclosure 100 through an access opening (see FIG. 12) in the bottom 108 of enclosure 100. In some embodiments, the access opening may be directly below cable duct 210.

In those embodiments in which a second enclosure cell includes electrical equipment requiring connection to external cables, method 1000 may continue as follows.

At process block 1012, one end of a second electrical cable may be electrically connected to a second cable terminal. For example, in an upward cable feed configuration, the second electrical cable may be connected to, e.g., cable terminal 214 of upper enclosure cell 102. In a downward cable feed configuration, the second electrical cable may be connected to, e.g., cable terminal 314 of lower enclosure cell 104. The electrical connection of the second cable to the second cable terminal may be made in any suitable manner.

At process block 1014, the second electrical cable may be fed through the first duct. In some embodiments, the first duct may be cable duct 212. In some alternative embodiments, the first duct may be cable duct 210 if, e.g., any one of cable terminals 214 and/or 314 is located in cable duct 210.

At process block 1016, the second electrical cable may be passed out of the enclosure. For example, in an upward cable feed configuration, the first electrical cable may, in some embodiments, be passed upward through cable duct 212 and out of enclosure 100 through an access opening (see FIG. 11) in the top 106 of enclosure 100. In some embodiments, the access opening may be directly above cable duct 212. In a downward cable feed configuration, the first electrical cable may, in some embodiments, be passed downward through cable duct 212 and out of enclosure 100 through an access opening (see FIG. 12) in the bottom 108 of enclosure 100. In some embodiments, the access opening may be directly below cable duct 212.

Figure 11:
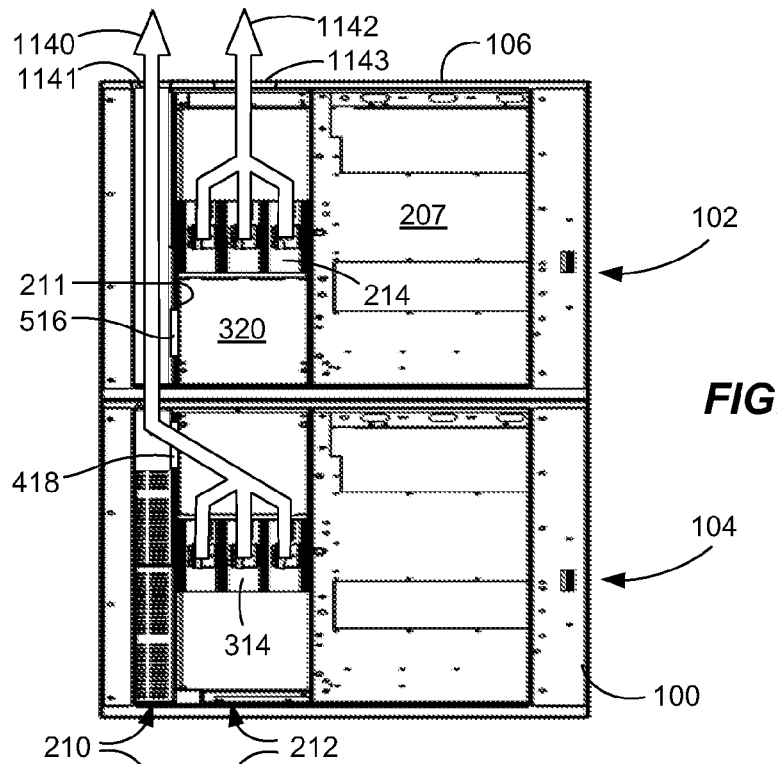
FIGS. 11 and 12 illustrate front views of an enclosure having cables routed through a cable duct system in upward and downward cable feed configurations, respectively, according to embodiments.

FIG. 11 illustrates cable routing through the cable duct system of enclosure 100 configured in an upward cable feed configuration, such as, e.g., upward cable feed configuration 300, in accordance with one or more embodiments. As shown, a first cable, represented by arrow 1140, may connect to cable terminal 314 in cable duct 212 of lower enclosure cell 104. First cable 1140 may be fed upward in cable duct 212 from cable terminal 314, through opening 418 in wall 211 of lower enclosure cell 104 (or alternatively through opening 516 of upper enclosure cell 102), and into cable duct 210. First cable 1140 may then be fed upward through cable duct 210 of upper enclosure cell 102 and passed out of enclosure 100 through an access opening 1141 in the top 106 of enclosure 100. A second cable, represented by arrow 1142, may connect to cable terminal 214 in cable duct 212 of upper enclosure cell 102. Second cable 1142 may be fed upward in cable duct 212 from cable terminal 214 and passed out of enclosure 100 through an access opening 1143 in the top 106 of enclosure 100. In some embodiments, access openings 1141 and 1143 may be the same opening in top 106. In some alternative embodiments, cables 1140 and/or 1142 may be connected to cable terminals 314 and 214, respectively, in a reverse routing process. That is, cables 1140 and/or 1142 may first be inserted through respective openings 1141 and/or 1143, fed downward in respective cable ducts 210 and 212, and then connected to respective cable terminals 314 and 214.

Figure 12:
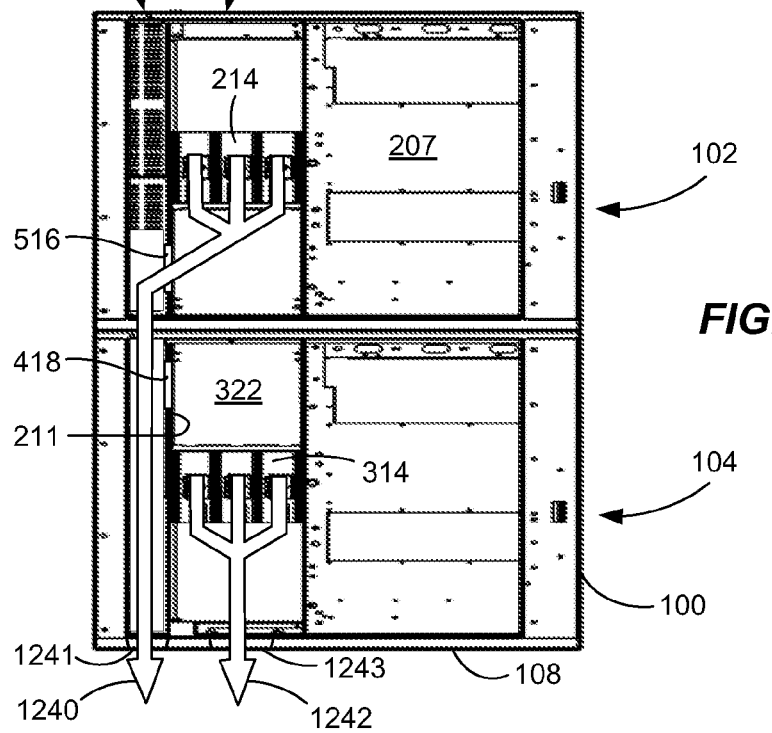

FIG. 12 illustrates cable routing through the cable duct system of enclosure 100 configured in a downward cable feed configuration, such as, e.g., downward cable feed configuration 600, in accordance with one or more embodiments. As shown, a first cable, represented by arrow 1240, may connect to cable terminal 214 in cable duct 212 of upper enclosure cell 102. First cable 1240 may be fed downward in cable duct 212 from cable terminal 214, through opening 516 in wall 211 of upper enclosure cell 102 (or alternatively through opening 418 of lower enclosure cell 104), and into cable duct 210. First cable 1240 may then be fed downward through cable duct 210 and passed out of enclosure 100 through an access opening 1241 in the bottom 108 of enclosure 100. A second cable, represented by arrow 1242, may connect to cable terminal 314 in cable duct 212 of lower enclosure cell 104. Second cable 1242 may be fed downward in cable duct 212 from cable terminal 314 and passed out of enclosure 100 through an access opening 1243 in the bottom 108 of enclosure 100. In some embodiments, access openings 1241 and 1243 may be the same opening in bottom 108. In some alternative embodiments, cables 1240 and/or 1242 may be connected to cable terminals 214 and 314, respectively, in a reverse routing process. That is, cables 1240 and/or 1242 may first be inserted through respective openings 1241 and/or 1243, fed upward in respective cable ducts 210 and 212, and then connected to respective cable terminals 214 and 314.

Figure 13:
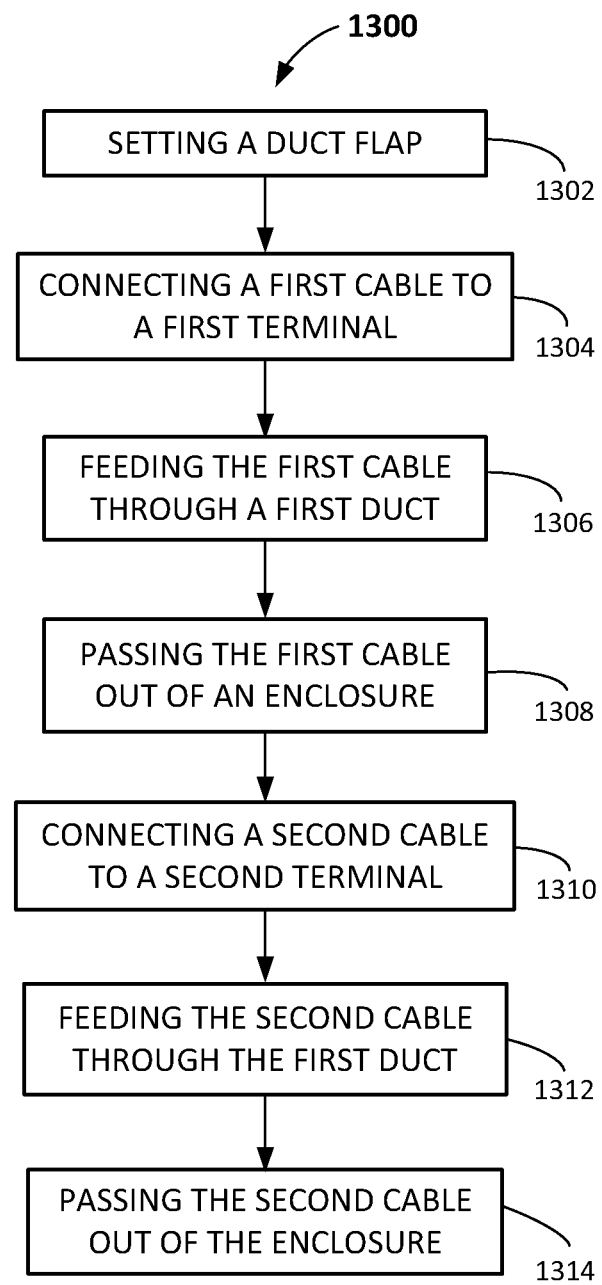
FIG. 13 illustrates a flowchart of another method of routing one or more cables through an enclosure to electrically connect to electrical equipment housed in the enclosure according to embodiments.

FIG. 13 illustrates another method of routing one or more cables through an enclosure to electrically connect to electrical equipment that may be housed in the enclosure in accordance with one or more embodiments. Method 1300 may include at process block 1302 setting a duct flap, such as, e.g., one of duct flaps 320 or 322. In some embodiments, duct flap 320 in upper enclosure cell 102 may be set in the diagonal position across cable duct 212, as best shown in FIGS. 4 and 5. In other embodiments, duct flap 322 in lower enclosure cell 104 may be set in the diagonal position across cable duct 212, as best shown in FIGS. 7 and 8. In some embodiments, both duct flaps 320 and 322 may be set in their respective diagonal position across cable duct 212. The diagonal position of either duct flap 320 and/or duct flap 322 may block the portion of cable duct 212 in upper enclosure cell 102 from the portion of cable duct 212 in lower enclosure cell 104. The diagonal position of either duct flap 320 and/or duct flap 322 may also block openings 418 and/or 516 from cables that may be routed through cable duct 212.

At process block 1304, method 1300 may include electrically connecting one end of a first electrical cable to a first cable terminal. The first electrical cable may be connected to, e.g., cable terminal 214 of upper enclosure cell 102. Alternatively, the first electrical cable may be connected to, e.g., cable terminal 314 of lower enclosure cell 104. The electrical connection of the first cable to the first cable terminal may be made in any suitable manner.

At process block 1306, the first electrical cable may be fed through a first duct. In some embodiments, the first duct may be cable duct 212. If the first electrical cable is connected to cable terminal 214, then the first electrical cable may be fed upward through the portion of cable duct 212 in the upper enclosure cell 102. If the first electrical cable is connected to cable terminal 314, then the first electrical cable may be fed downward through the portion of cable duct 212 in the lower enclosure cell 104. In some alternative embodiments, the first duct may be cable duct 210 if, e.g., any one of cable terminals 214 and/or 314 is located in cable duct 210.

At process block 1308, method 1300 may include passing the first cable out of an enclosure. In those embodiments in which the first electrical cable is connected to cable terminal 214 in cable duct 212, the first electrical cable may be passed upward through cable duct 212 and out of an enclosure, which may be, e.g., enclosure 100. The first electrical cable may pass through, e.g., access opening 1143 in the top 106 of enclosure 100. In those embodiments in which the first electrical cable is connected to cable terminal 314 in cable duct 212, the first electrical cable may be passed downward through cable duct 212 and out of, e.g., enclosure 100. The first electrical cable may pass through, e.g., access opening 1243 in the bottom 108 of enclosure 100.

At process block 1310, one end of a second electrical cable may be electrically connected to a second cable terminal. If the first electrical cable is connected to cable terminal 214, then the second electrical cable may be connected to, e.g., cable terminal 314 of lower enclosure cell 104. If the first electrical cable is connected to cable terminal 314, then the second electrical cable may be connected to, e.g., cable terminal 214 of upper enclosure cell 102. The electrical connection of the second cable to the second cable terminal may be made in any suitable manner.

At process block 1312, the second electrical cable may be fed through the first duct. If the second electrical cable is connected to cable terminal 214, then the second electrical cable may be fed upward through the portion of cable duct 212 in the upper enclosure cell 102. If the second electrical cable is connected to cable terminal 314, then the second electrical cable may be fed downward through the portion of cable duct 212 in the lower enclosure cell 104. In some embodiments, the first duct may be cable duct 212. In some alternative embodiments, the first duct may be cable duct 210 if, e.g., any one of cable terminals 214 and/or 314 is located in cable duct 210.

At process block 1314, method 1300 may include passing the second cable out of the enclosure. In those embodiments in which the second electrical cable is connected to cable terminal 314 in cable duct 212, the second electrical cable may be passed downward through cable duct 212 and out of, e.g., enclosure 100 through access opening 1243 in the bottom 108 of enclosure 100. In those embodiments in which the second electrical cable is connected to cable terminal 214 in cable duct 212, the second electrical cable may be passed upward through cable duct 212 and out of, e.g., enclosure 100 through access opening 1143 in the top 106 of enclosure 100.

Figure 14:
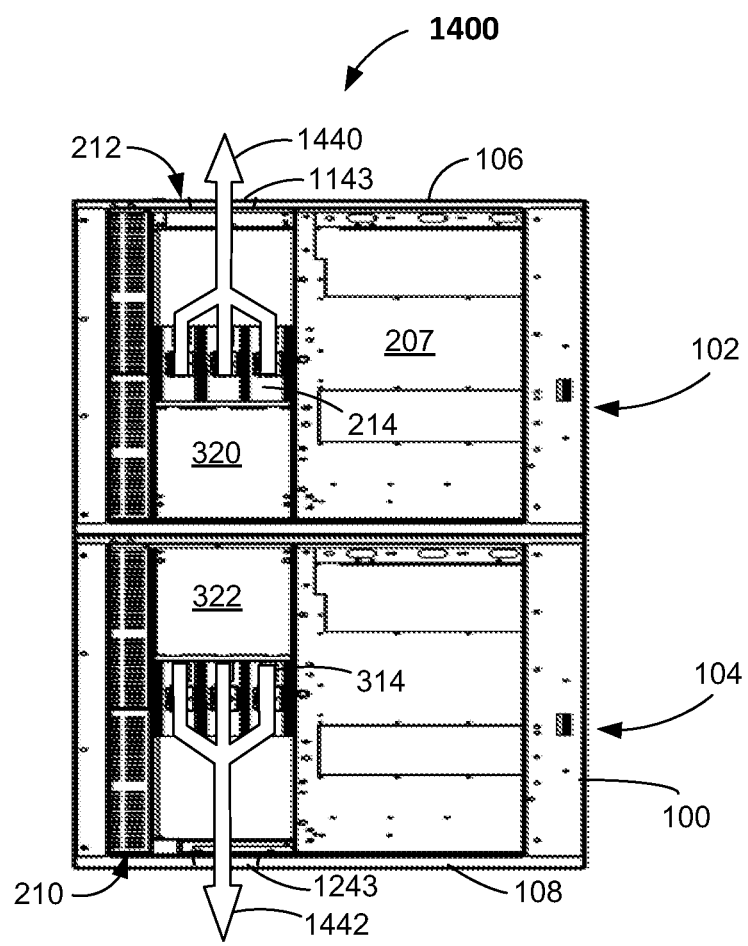
FIG. 14 illustrates a front view of an enclosure having cables routed through a cable duct system in an alternative cable feed configuration according to embodiments.

FIG. 14 illustrates an alternative cable feed configuration 1400 in accordance with one or more embodiments. Cable feed configuration 1400 may illustrate the cable routing described above in connection with method 1300. As shown, a first cable, represented by arrow 1440, may connect to cable terminal 214 in cable duct 212 of the upper enclosure cell 102. First cable 1440 may be fed upward in cable duct 212 from cable terminal 214 and passed out of enclosure 100 through access opening 1143 in the top 106 of enclosure 100. A second cable, represented by arrow 1442, may connect to cable terminal 314 in cable duct 212 of the lower enclosure cell 104. Second cable 1442 may be fed downward in cable duct 212 from cable terminal 314 and passed out of enclosure 100 through access opening 1243 in the bottom 108 of enclosure 100. Cable duct 210 may not be used in some embodiments of cable feed configuration 1400. In some embodiments, only one of duct flaps 320 and 322 may be included in cable feed configuration 1400, and that duct flap may be set in its diagonal position across cable duct 212. In other embodiments, duct flaps 320 and 322 may both be set in their respective diagonal position across cable duct 212 (FIGS. 4 and 5 show the diagonal position of duct flap 320, and FIGS. 7 and 8 show the diagonal position of duct flap 322).

Figure 15:
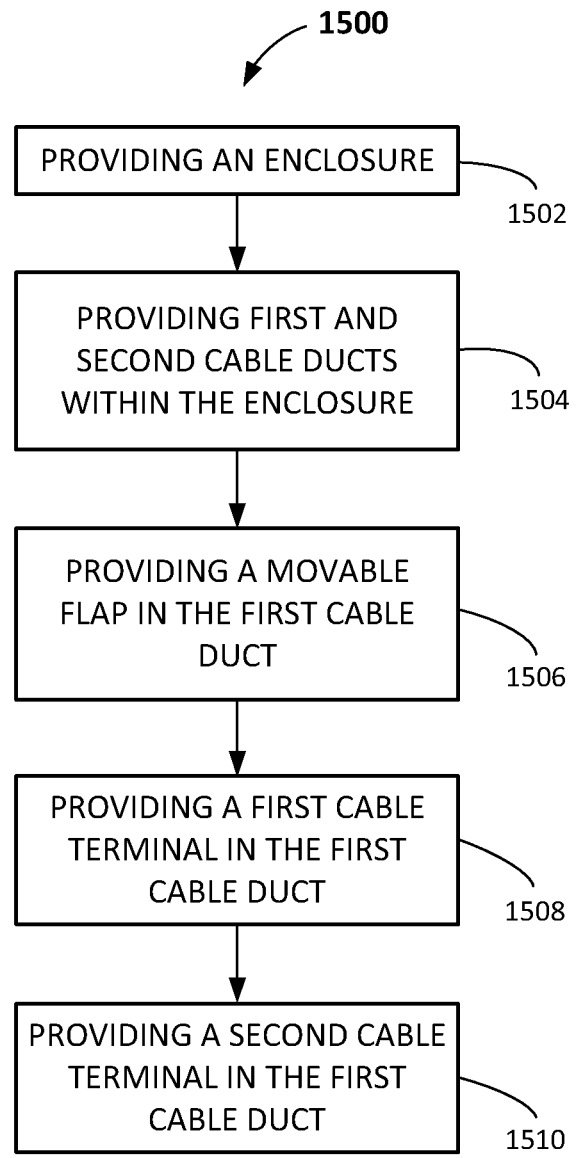
FIG. 15 illustrates a flowchart of a method of assembling a cable duct system in an enclosure according to embodiments.

FIG. 15 illustrates a method of assembling a cable duct system in accordance with one or more embodiments. At process block 1502, method 1500 may include providing an enclosure. The enclosure may be configured to house electrical equipment and may be a generally rectangular enclosed structure. In some embodiments, the enclosure may be identical or similar to, e.g., enclosure 100, and may have an upper enclosure cell 102 stacked on top of a lower enclosure cell 104, wherein each enclosure cell may house electrical equipment requiring separate cable connections. Alternatively, other suitable enclosures may be provided at process block 1502.

At process block 1504, method 1500 may include providing first and second cable ducts within the enclosure. The first and second cable ducts may, in some embodiments, be configured in a side-by-side arrangement having at least one interior wall between them. The interior wall may have one or more openings configured to allow electrical cables to pass from one cable duct to the other cable duct. In some embodiments, the first and second cable ducts may be of different size. The first and second cable ducts may be, e.g., cable ducts 210 and 212 of enclosure 100.

At process block 1506, a movable duct flap may be provided in the first cable duct. The movable duct flap may have first and second positions in which the movable duct flap in the first position may prevent a cable from being received through the one or more openings between the first and second cable ducts, and the movable duct flap in the second position may allow a cable to be received through the one or more openings between the first and second cable ducts. In some embodiments, the movable duct flap may be, e.g., either one of duct flaps 320 or 322.

At process block 1508, a first cable terminal may be provided in the first cable duct. The first cable terminal may be electrically connected to electrical equipment that may be housed in the enclosure or in an enclosure cell, such as, e.g., upper enclosure cell 102 or lower enclosure cell 104. The first cable terminal may be configured to be electrically connectable to an external cable that may provide power and/or control signaling to electrical equipment that may be housed in the enclosure or an enclosure cell. In some embodiments, the first cable terminal may be, e.g., either of cable terminals 214 or 314, and/or may be located within, e.g., cable duct 212. Alternatively, the first cable terminal may be located within, e.g., cable duct 210. The first cable terminal may, in some embodiments, be mounted to any suitable wall or structure within cable duct 210 or 212.

At process block 1510, method 1500 may include providing a second cable terminal in the first cable duct. The second cable terminal may be identical or similar to the first cable terminal, and may be electrically connected to electrical equipment that may be housed in the enclosure or in an enclosure cell, such as, e.g., upper enclosure cell 102 or lower enclosure cell 104. The second cable terminal may be configured to be electrically connectable to an external cable that may provide power and/or control signaling to electrical equipment that may be housed in the enclosure or an enclosure cell. In some embodiments, the second cable terminal may be, e.g., either of cable terminals 214 or 314, and/or may be located within, e.g., cable duct 212. Alternatively, the second cable terminal may be located within, e.g., cable duct 210. The second cable terminal may, in some embodiments, be mounted to any suitable wall or structure within cable duct 210 or 212.

The above process blocks of methods 1000, 1300, and/or 1500 may be executed or performed in an order or sequence not limited to the order and sequence shown and described. For example, in some embodiments, process blocks 1002-1010 of method 1000 may be performed after process blocks 1012-1016. Also, some of the process blocks of methods 1000, 1300, and/or 1500 may be executed or performed substantially simultaneously or in parallel where appropriate or desired. For example, in some embodiments, process blocks 1304-1308 of method 1300 may be performed substantially simultaneously or in parallel with process blocks 1310-1314.

Persons skilled in the art should readily appreciate that the invention described herein is susceptible of broad utility and application. Many embodiments and adaptations of the invention other than those described herein, as well as many variations, modifications, and equivalent arrangements, will be apparent from, or reasonably suggested by, the invention and the foregoing description thereof, without departing from the substance or scope of the invention. For example, although described in connection with enclosures housing electrical equipment such as voltage controllers, one or more embodiments of the invention may be used with other types of enclosures having pathways for electrical cables and/or other types of wiring. Accordingly, while the invention has been described herein in detail in relation to specific embodiments, it should be understood that this disclosure is only illustrative and presents examples of the invention and is made merely for purposes of providing a full and enabling disclosure of the invention. This disclosure is not intended to limit the invention to the particular apparatus, devices, assemblies, systems or methods disclosed, but, to the contrary, the intention is to cover all modifications, equivalents, and alternatives falling within the scope of the invention.

What is claimed is:

1. A method of routing one or more cables through an enclosure, the method comprising:
setting a first flap in one of two positions based on whether a first cable is to exit an enclosure through an opening in the top or in the bottom of the enclosure;
electrically connecting the first cable to a first cable terminal located in a first cable duct of the enclosure;
feeding the first cable through the first cable duct from the first cable terminal;
feeding the first cable into a second cable duct of the enclosure from the first cable duct through a first opening between the first and second cable ducts;
passing the first cable from the second cable duct through an opening in a top or a bottom of the enclosure
electrically connecting a second cable to a second cable terminal located in the first cable duct;
feeding the second cable through the first cable duct from the second cable terminal;
passing the second cable from the first cable duct through an opening in the top or in the bottom of the enclosure; and
setting a second flap in one of two positions based on whether the first cable is to exit the enclosure through the opening in the top or in the bottom of the enclosure.

2. The method of claim 1 wherein the:
setting a first flap comprises setting the first flap in a first position;
setting a second flap comprises setting the second flap in a second position;
passing the first cable comprises passing the first cable through the opening in the top of the enclosure; and
passing the second cable comprises passing the second cable through the opening in the top of the enclosure.

3. The method of claim 1 wherein the:
setting a first flap comprises setting the first flap in a second position;
setting a second flap comprises setting the second flap in a first position;
passing the first cable comprises passing the first cable through the opening in the bottom of the enclosure; and
passing the second cable comprises passing the second cable through the opening in the bottom of the enclosure.

\* \* \* \* \*